(12) United States Patent
Ikeda

(10) Patent No.: US 9,386,698 B2
(45) Date of Patent: Jul. 5, 2016

(54) MODULE, MODULE COMBINED BODY AND MODULE PRODUCTION METHOD

(71) Applicant: SHINDENGEN ELECTRIC MANUFACTURING CO., LTD., Chiyoda-Ku (JP)

(72) Inventor: Kosuke Ikeda, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 223 days.

(21) Appl. No.: 14/369,340

(22) PCT Filed: Feb. 28, 2013

(86) PCT No.: PCT/JP2013/055443
§ 371 (c)(1),
(2) Date: Jun. 27, 2014

(87) PCT Pub. No.: WO2014/132397
PCT Pub. Date: Sep. 4, 2014

(65) Prior Publication Data
US 2015/0189756 A1 Jul. 2, 2015

(51) Int. Cl.
| H05K 7/00 | (2006.01) |
| H05K 1/18 | (2006.01) |
| H05K 13/00 | (2006.01) |
| H01L 23/538 | (2006.01) |
| H01L 25/07 | (2006.01) |
| H02M 7/00 | (2006.01) |
| H01L 23/498 | (2006.01) |

(52) U.S. Cl.
CPC ............ *H05K 1/18* (2013.01); *H01L 23/49811* (2013.01); *H01L 23/5385* (2013.01); *H01L 25/071* (2013.01); *H02M 7/003* (2013.01); *H05K13/0023* (2013.01); *H01L 2224/48137* (2013.01); *H01L 2224/49111* (2013.01); *H01L 2924/1305* (2013.01); *Y10T 29/49146* (2015.01)

(58) Field of Classification Search
USPC ......... 361/760–763, 770, 775, 781–784, 790, 361/803; 257/666–730, 787–790
See application file for complete search history.

(56) References Cited

U.S. PATENT DOCUMENTS

| 6,350,949 B1 * | 2/2002 | Boyd | H05K 7/026 174/17.05 |
| 2013/0021749 A1 * | 1/2013 | Nakajima | H02M 7/003 361/689 |

FOREIGN PATENT DOCUMENTS

JP 2005-073342 3/2005
(Continued)

OTHER PUBLICATIONS

International Search Report dated May 14, 2013 for PCT Application No. PCT/JP2013/055443 and its English translation from WIPO.
Written Opinion dated May 14, 2015 for PCT Application No. PCT/JP2013/055443 and its English translation by Google Translate.
(Continued)

*Primary Examiner* — Tuan T Dinh
(74) *Attorney, Agent, or Firm* — Ladas & Parry, LLP

(57) ABSTRACT

A module comprises a first insulating-substrate-side member that has a first insulating substrate, a first conductor layer provided on the first insulating substrate, and a first electronic element provided on the first conductor layer; a second insulating-substrate-side member that has a second insulating substrate, a second conductor layer provided on a lower side of the second insulating substrate, and a second electronic element provided on a lower side of the second conductor layer; and a sealing member that is provided between the first insulating substrate and the second insulating substrate. The first electronic element and the second electronic element are opposingly disposed. The first electronic element and the second electronic element are connected by an element connecting conductor post that has electric conductivity.

10 Claims, 6 Drawing Sheets

(56) References Cited

FOREIGN PATENT DOCUMENTS

| | | |
|---|---|---|
| JP | 2006-134990 | 5/2006 |
| JP | 2009-177038 | 8/2009 |
| JP | 2013-041939 | 2/2013 |

OTHER PUBLICATIONS

International Preliminary Report on Patentability (Chapter II) dated Sep. 25, 2013 for PCT Application No. PCT/JP2013/055443 and its English translation from WIPO.

* cited by examiner

MODULE, MODULE COMBINED BODY AND MODULE PRODUCTION METHOD

CROSS REFERENCE TO RELATED APPLICATION

This application is the national stage of International Patent Application no. PCT/JP2013/055443, filed on Feb. 28, 2013, the disclosure of which is incorporated herein in its entirety.

TECHNICAL FIELD

The present invention relates to a module comprising a plurality of electronic elements, a module combined body and a module production method.

BACKGROUND ART

Conventionally, there is known a module in which electronic elements such as transistors and diodes are disposed on a single plane and both faces of these electronic elements are sandwiched by electrodes (see Patent Literature 1, for example). For obtaining a high power in such a module, attempts to increase the sizes of electronic elements 110 or increase the number of electronic elements 110 have been performed (2 in 1, 4 in 1, 6 in 1 and the like) (see FIG. 7).

However, on the other hand, the downsizing of the module is desired. When reducing the size of the module while using large-size electronic elements 110 or using many electronic elements 110 as described above, there is a possibility that the heat radiation decreases, resulting in a thermal runaway of the module.

Further, in use of many electronic elements 110, in the case of connecting the electronic elements 110 with wires 120 or the like (see FIG. 7), the length of the wire 120 increases in some points, leading to an increase in parasitic inductance and wiring resistance. Incidentally, FIG. 7 shows a mode of "6 in 1" in which six electronic elements 110 are provided.

CITATION LIST

Patent Literature

[Patent Literature 1] Japanese Patent Laid-Open No. 2005-73342

SUMMARY OF INVENTION

Technical Problem

In view of the above, the present invention provides a module and a module combined body that make it possible to reduce the size, to maintain the heat radiation, and further to reduce the parasitic inductance and the wiring resistance, even when disposing many electronic elements, and provides a production method of such a module.

Solution to Problem

A module according to the present invention comprises:
a first insulating-substrate-side member that has a first insulating substrate, a first conductor layer provided on an upper side of the first insulating substrate, and a first electronic element provided on an upper side of the first conductor layer;
a second insulating-substrate-side member that has a second insulating substrate, a second conductor layer provided on a lower side of the second insulating substrate, and a second electronic element provided on a lower side of the second conductor layer; and
a sealing member that is provided between the first insulating substrate and the second insulating substrate,
wherein the first electronic element and the second electronic element are opposingly disposed, and
the first electronic element and the second electronic element are connected by an element connecting conductor post that has electric conductivity.

In the module according to the present invention,
the first electronic element may have a first switching element and a first rectifying element,
the second electronic element may have a second switching element and a second rectifying element,
the element connecting conductor post may have a plurality of element connecting conductor post units,
one of the element connecting conductor post units may connect the first switching element and the second rectifying element, and
another one of the element connecting conductor post units may connect the second switching element and the first rectifying element.

In the module according to the present invention,
the first conductor layer may have a plurality of first conductor layer units,
the second conductor layer may have a plurality of second conductor layer units,
the first switching element may be provided on one of the first conductor layer units,
the first rectifying element may be provided on another one of the first conductor layer units,
the second switching element may be provided on one of the second conductor layer units, and
the second rectifying element may be provided on another one of the second conductor layer units.

The module according to the present invention, may further comprise a layer connecting conductor post that has electric conductivity and connects the first conductor layer unit and the second conductor layer unit,
wherein the layer connecting conductor post may have a plurality of layer connecting conductor post units,
one of the layer connecting conductor post units may connect the first conductor layer unit on which the first switching element is provided and the second conductor layer unit on which the second rectifying element is provided, and
another one of the layer connecting conductor post units may connect the second conductor layer unit on which the second switching element is provided and the first conductor layer unit on which the first rectifying element is provided.

In the module according to the present invention,
wherein the first switching element and the first rectifying element may be connected by a conductor foil that has electric conductivity, or the second switching element and the second rectifying element may be connected by a conductor foil that has electric conductivity.

The module according to the present invention may further comprise:
a first control terminal that is connected with the first switching element, and
a second control terminal that is connected with the second switching element.

The module according to the present invention may further comprise:

an external terminal that is connected with the first switching element, the first rectifying element, the second switching element or the second rectifying element.

In the module according to the present invention, wherein each of the first switching element and the second switching element may be a bipolar transistor.

In the module according to the present invention, wherein each of the first rectifying element and the second rectifying element may be a diode.

The module according to the present invention may further comprise:

a first radiating member that is provided on a lower side of the first insulating substrate, and a second radiating member that is provided on an upper side of the second insulating substrate.

In the module according to the present invention, each of the first radiating member and the second radiating member may be a radiator foil that has thermal conductivity.

A module combined body according to the present invention comprises:

a power module that controls electric power; and a controlling module that controls the power module, wherein the power module is the module according to the present invention, and the module combined body is provided on a lower side of the first insulating substrate or an upper side of the second insulating substrate of the power module.

A module production method according to the present invention comprises:

preparing a first insulating-substrate-side member that has a first insulating substrate, a first conductor layer provided on an upper side of the first insulating substrate, and a first electronic element provided on an upper side of the first conductor layer;

preparing a second insulating-substrate-side member that has a second insulating substrate, a second conductor layer provided on an upper side of the second insulating substrate, and a second electronic element provided on an upper side of the second conductor layer;

inverting the second insulating substrate upside down, opposingly disposing the first electronic element and the second electronic element, and connecting the first electronic element and the second electronic element with an element connecting conductor post that has electric conductivity; and injecting a sealing member and disposing the sealing member between the first insulating substrate and the second insulating substrate.

Advantageous Effects of Invention

In the present invention, a first insulating-substrate-side member that has a first insulating substrate, a first conductor layer provided on the first insulating substrate, and a first electronic element provided on the first conductor layer, and a second insulating-substrate-side member that has a second insulating substrate, a second conductor layer provided on the second insulating substrate, and a second electronic element provided on the second conductor layer, are provided. Thereby, it is possible to dispose electronic elements on both of the first insulating-substrate-side member and the second insulating-substrate-side member, and to dispose many electronic elements in a small space.

Further, the heat of the first electronic element can be primarily radiated from the first insulating substrate side, and the heat of the second electronic element can be primarily radiated from the second insulating substrate side. Therefore, it is possible to realize a high heat radiation.

Further, the first electronic element and the second electronic element are opposingly disposed, and the first electronic element and the second electronic element are connected by an element connecting conductor post that has electric conductivity. Thereby, it is possible to position the first electronic element and the second electronic element at a short distance, and to connect the first electronic element and the second electronic element by an element connecting conductor post that has a lower electric resistance compared to a wire. Therefore, it is possible to reduce the parasitic inductance and the wiring resistance.

DESCRIPTION OF EMBODIMENTS

First Embodiment

<<Configuration>>

Hereinafter, a first embodiment of a module, module combined body and module production method according to the present invention will be described with reference to the drawings. Here, FIG. 1 to FIG. 5 are diagrams for describing the first embodiment of the present invention.

Figure 1:
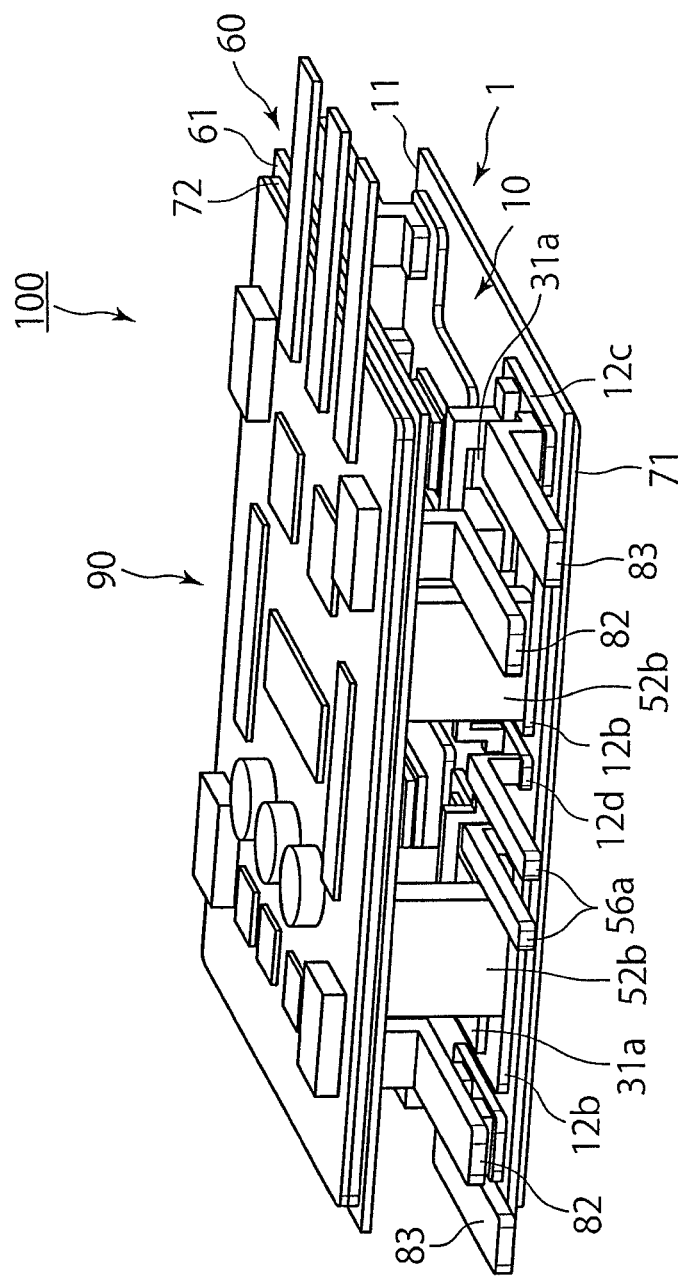
FIG. 1 is a schematic perspective diagram showing a module according to a first embodiment of the present invention.

As shown in FIG. 1, a module combined body 100 according to this embodiment has a power module 1 that controls electric power, and a controlling module 90 that controls the power module 1. Here, the module combined body 100 according to this embodiment is an inverter module, for example.

In this embodiment, as shown in FIG. 1, the controlling module 90 is provided on the upper surface (upper side) of a second insulating substrate 61 (described later) of the power module 1. Although FIG. 1 shows such a mode, without being limited to this, the controlling module 90 may be provided on the lower surface (lower side) of a first insulating substrate 11 (described later) of the power module 1.

Hereinafter, this embodiment will be described using a mode of "4 in 1" in which four electronic elements 31a, 31b, 32a, 32b are provided.

As shown in FIG. 4(a), the power module 1 according to this embodiment is provided with a first insulating-substrate-side member 10 that has the first insulating substrate 11, a first conductor layer 12 provided on the upper side of the first insulating substrate 11, and the first electronic elements 31a, 32a provided on the upper side of the first conductor layer 12. Also, as shown in FIG. 4(b), the power module 1 is provided with a second insulating-substrate-side member 60 that has the second insulating substrate 61, a second conductor layer 62 provided on the upper side of the second insulating substrate 61, and the second electronic elements 31b, 32b provided on the upper side of the second conductor layer 62.

Here, in FIG. 4(b), the second insulating-substrate-side member 60 has not been yet bonded on the first insulating-substrate-side member 10 (see FIG. 2 and FIG. 3), and therefore, is shown while being inverted upside down relative to the configuration of the final power module 1. That is, in the final power module 1, the second conductor layer 62 is provided on the lower side of the second insulating substrate 61, and the second electronic elements 31b, 32b are provided on the lower side of the second conductor layer 62 (see FIG. 2 and FIG. 3).

Incidentally, as shown in FIG. 4(a), (b), the power module 1 according to this embodiment has an arrangement structure with a bilateral symmetry (a symmetry with respect to line $A_1$-$A_1$ in FIG. 4(a) and line $A_2$-$A_2$ in FIG. 4(b)).

Ceramic can be raised as an example of the material of the first insulating substrate 11 and the second insulating substrate 61. Copper can be raised as an example of the material of the first conductor layer 12 and the second conductor layer 62.

Figure 3:
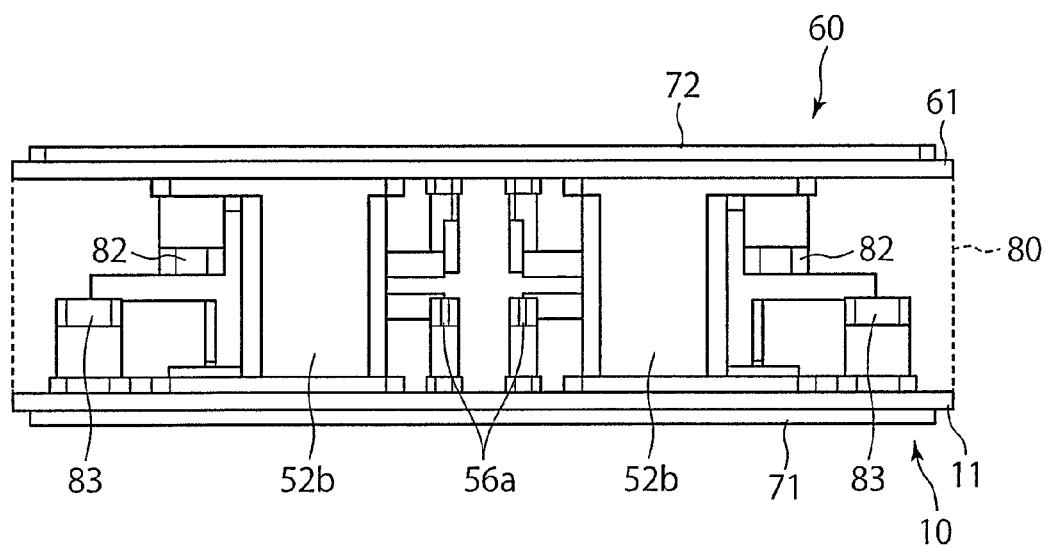
FIG. 3 is a schematic lateral diagram of a mode in which a sealing member is provided in the module shown in FIG. 2, viewed from the lateral direction.

Furthermore, as shown in FIG. 3, a sealing member 80 composed of a resin material or the like is provided between the first insulating substrate 11 and the second insulating substrate 61. In FIG. 3, the sealing member 80 is shown by the "dotted lines".

The first electronic elements 31a, 32a and the second electronic elements 31b, 32b are opposingly disposed. Then, the first electronic elements 31a, 32a and the second electronic elements 31b, 32b are connected by an element connecting conductor post 51 that has electric conductivity and linearly extends in the vertical direction. Copper can be raised as an examples of the material of the element connecting conductor post 51. Then, the element connecting conductor post 51 can be formed of a thicker copper foil compared to conductor foils 54a, 54b described later.

As shown in FIG. 4(a), the first electronic elements 31a, 32a have a first switching element 31a and a first rectifying element 32a. Further, as shown in FIG. 4(b), the second electronic elements 31b, 32b have a second switching element 31b and a second rectifying element 32b. In the power module 1, the first switching element 31a and the second rectifying element 32b are opposingly disposed, and the second switching element 31b and the first rectifying element 32a are opposingly disposed. Further, the element connecting conductor post 51 has a plurality of element connecting conductor post units 51a, 51b. Then, the element connecting conductor post unit 51a that is one of the element connecting conductor post units 51a, 51b connects the first switching element 31a and the second rectifying element 32b, and the element connecting conductor post unit 51b that is the other one of the element connecting conductor post units 51a, 51b connects the second switching element 31b and the first rectifying element 32a.

The switching elements 31a, 31b used in this embodiment, that is, the first switching element 31a and the second switching element 31b are respectively a bipolar transistor, for example. The rectifying elements 32a, 32b used in this embodiment, that is, the first rectifying element 32a and the second rectifying element 32b are respectively a diode, for example.

As shown in FIG. 4(a), the first conductor layer 12 has a plurality of first conductor layer units 12a to 12d. Also, as shown in FIG. 4(b), the second conductor layer 62 has a plurality of second conductor layer units 62a to 62c. Then, as shown in FIG. 4(a), the first switching element 31a is provided on the first conductor layer unit 12b that is one of the first conductor layer units 12a to 12d, and the first rectifying element 32a is provided on the first conductor layer unit 12a that is another one of the first conductor layer units 12a to 12d. Further, as shown in FIG. 4(b), the second switching element 31b is provide on the second conductor layer unit 62b that is one of the second conductor layer units 62a to 62c, and the second rectifying element 32b is provided on the second conductor layer unit 62a that is another one of the second conductor layer units 62a to 62c.

The power module 1 according to this embodiment further comprises a layer connecting conductor post 52 that connects the first conductor layer units 12a, 12b and the second conductor layer units 62a, 62b. The layer connecting conductor post 52 has electric conductivity, and Copper can be raised as an example of the material. Then, for example, the layer connecting conductor post 52 can be formed of a copper foil with substantially the same thickness as the element connecting conductor post 51.

The layer connecting conductor post 52 has a plurality of layer connecting conductor post units 52a, 52b. As shown in FIG. 4(b), the layer connecting conductor post unit 52b that is one of the layer connecting conductor post units 52a, 52b, is provided on the second conductor layer unit 62a, and connects the second conductor layer unit 62a and the first conductor layer unit 12b. Further, as shown in FIG. 4(a), the layer connecting conductor post unit 52a that is the other one of the layer connecting conductor post units 52a, 52b, is provided on the first conductor layer unit 12a, and connects the first conductor layer unit 12a and the second conductor layer unit 62b.

As shown in FIG. 4(b), in this embodiment, the second switching element 31b and the second rectifying element 32b are connected through a conductor foil 53 and the second conductor layer unit 62a. The conductor foil 53 is formed of, for example, a copper foil that has electric conductivity, or the like. Incidentally, the conductor foil 53 in this embodiment is integral with the element connecting conductor post unit 51b, and laterally extends from a side wall of the element connecting conductor post unit 51b to be connected with the second conductor layer unit 62a.

As shown in FIG. 4(a), a first control terminal 56a is connected with the first switching element 31a through a conductor foil 54a and the first conductor layer unit 12d, and as shown in FIG. 4(b), a second control terminal 56b is connected with the second switching element 31b through the second conductor layer unit 62b, a conductor foil 54b and the conductor layer unit 62c.

As shown in FIG. 4(a), (b), external terminals 81 to 83 are connected with the first switching element 31a, the first rectifying element 32a, the second switching element 31b and the second rectifying element 32b, respectively. More concretely, the external terminal 81 is connected with the first rectifying element 32a through the first conductor layer unit 12a. The external terminal 82 is connected with the second rectifying element 32b through the second conductor layer unit 62a. The external terminal 83 is connected with the first switching element 31a through the element connecting conductor post unit 51*a*, a conductor foil 55 and the first conductor layer unit 12*c*. Incidentally, the conductor foil 55 in this embodiment is integral with the element connecting conductor post unit 51*a*, and laterally extends from a side wall of the element connecting conductor post unit 51*a* to be connected with the first conductor layer unit 12*c*.

Figure 2:
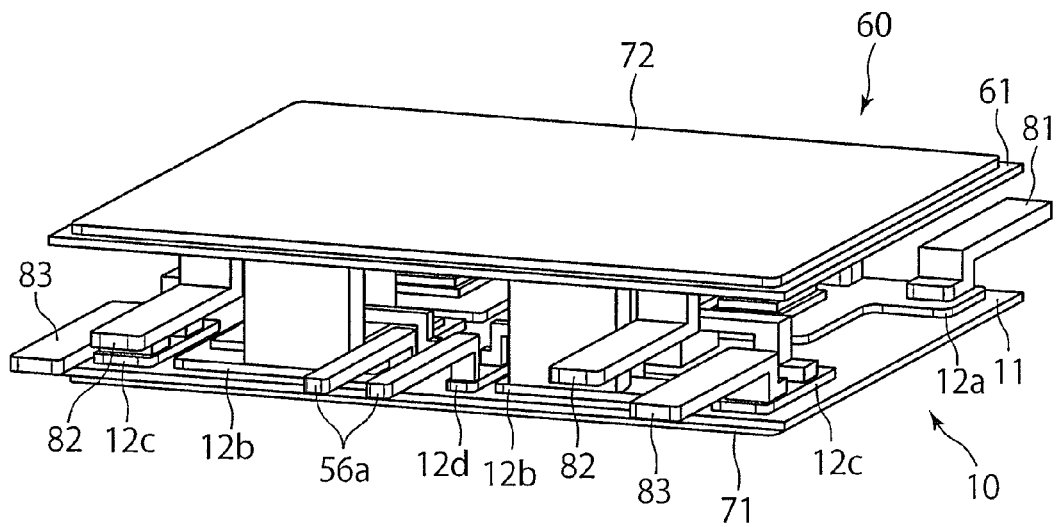
FIG. 2 is a schematic perspective diagram showing a state in which a controlling module is not mounted, in the module according to the first embodiment of the present invention.

In this embodiment, as shown in FIG. 2 and FIG. 3, a first radiating member 71 that has thermal conductivity and has a planar shape is provided on the lower side of the first insulating substrate 11. Also, a second radiating member 72 that has thermal conductivity and has a planar shape is provided on the upper side of the second insulating substrate 61. Copper can be raised as an example of the material of the first radiating member 71 and the second radiating member 72. Further, it is possible that each of the first radiating member 71 and the second radiating member 72 is a radiator foil, for example, a copper foil. In this embodiment, as described above, the controlling module 90 is provided on the upper surface of the second radiating member 72 composed of a copper foil or the like.

<<Production Method>>

Next, the production method of the power module 1 according to this embodiment will be briefly described.

First, the first insulating-substrate-side member 10 and the second insulating-substrate-side member 60 are prepared.

Figure 4:
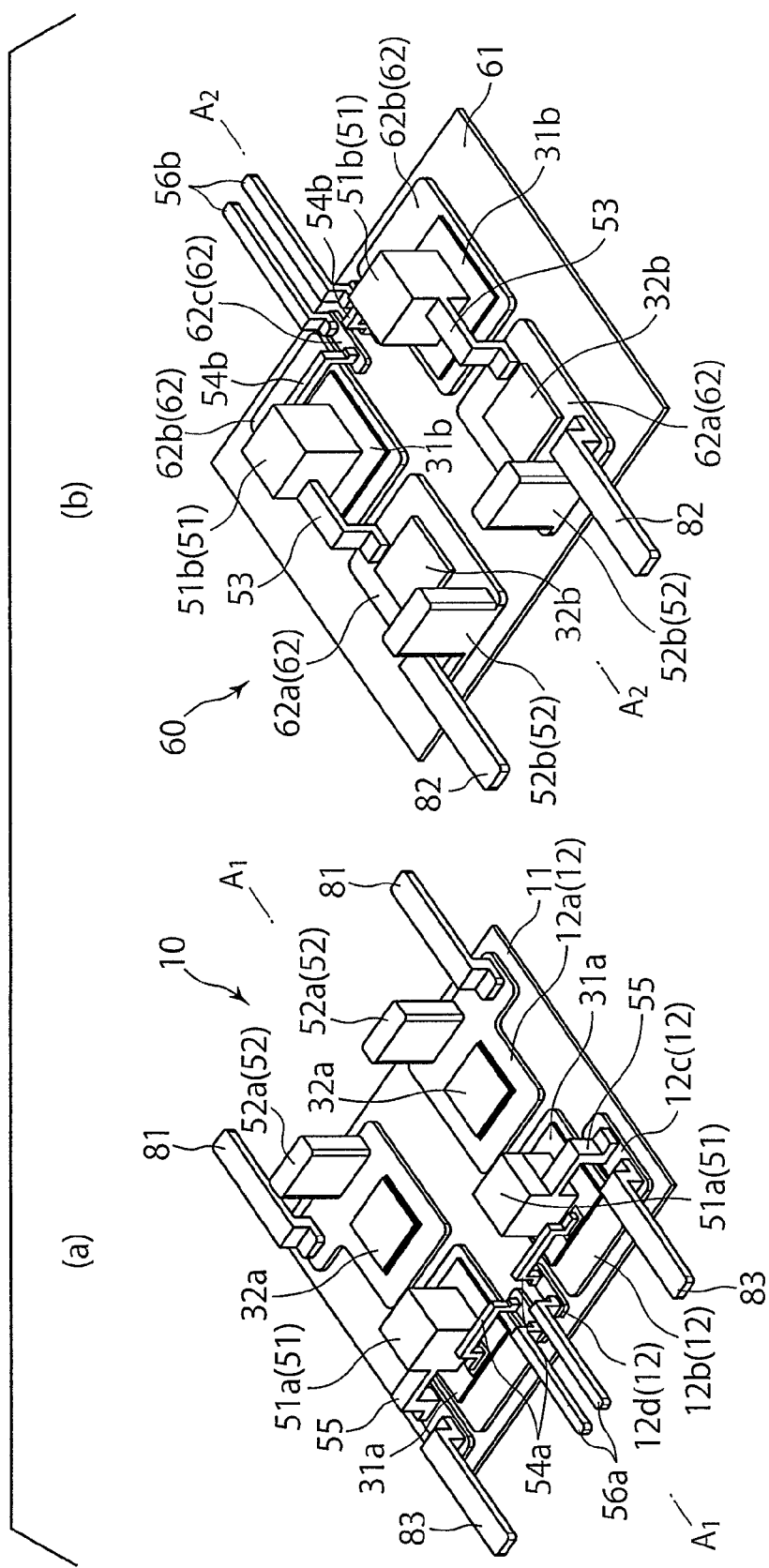
FIG. 4(a) is a schematic perspective diagram showing a first insulating-substrate-side member and FIG. 4(b) is a schematic perspective diagram showing a second insulating-substrate-side member, in the module according to the first embodiment of the present invention.

In this embodiment, as shown in FIG. 4(*a*), the first insulating-substrate-side member 10 has the first insulating substrate 11, the first conductor layer units 12*a* to 12*d* provided on the upper side of the first insulating substrate 11, the first switching element 31*a* provided on the upper side of the first conductor layer unit 12*b* that is one of the first conductor layer units 12*a* to 12*d*, the first rectifying element 32*a* provided on the upper side of the first conductor layer unit 12*a* that is another one of the first conductor layer units 12*a* to 12*d*, the element connecting conductor post unit 51*a* provided on the upper side of the first switching element 31*a*, the layer connecting conductor post unit 52*a* provided on the upper side of the first conductor layer unit 12*a*, and the first radiating member 71 provided on the lower side of the first insulating substrate 11. Further, as shown in FIG. 4(*b*), the second insulating-substrate-side member 60 has the second insulating substrate 61, the second conductor layer units 62*a* to 62*c* provided on the upper side of the second insulating substrate 61, the second switching element 31*b* provided on the upper side of the second conductor layer unit 62*b* that is one of the second conductor layer units 62*a* to 62*c*, the second rectifying element 32*b* provided on the upper side of the second conductor layer unit 62*a* that is another one of the second conductor layer units 62*a* to 62*c*, the element connecting conductor post unit 51*b* provided on the upper side of the second switching element 31*b*, the layer connecting conductor post unit 52*b* provided on the upper side of the second conductor layer unit 62*a*, and the second radiating member 72 provided on the lower side of the second insulating substrate 61.

Next, the second insulating-substrate-side member 60 is inverted upside down, and then the first electronic elements 31*a*, 32*a* and the second electronic elements 31*b*, 32*b* are opposingly disposed (see FIG. 2 and FIG. 3). More concretely, they are disposed such that the second rectifying element 32*b* is opposed to the first switching element 31*a* and the second switching element 31*b* is opposed to the first rectifying element 32*a*. Then, the first switching element 31*a* and the second rectifying element 32*b* are connected by the element connecting conductor post unit 51*a* provided on the first switching element 31*a*, and the second switching element 31*b* is connected to the first rectifying element 32*a* by the element connecting conductor post unit 51*b* provided on the second switching element 31*b*. At this time, the first conductor layer unit 12*b* and the second conductor layer unit 62*a* are connected by the layer connecting conductor post unit 52*b* provided on the second conductor layer unit 62*a*, and the first conductor layer unit 12*a* and the second conductor layer unit 62*b* are connected by the layer connecting conductor post unit 52*a* provided on the first conductor layer unit 12*a*.

After going through the above steps, the sealing member 80 is injected and the sealing member 80 is disposed between the first insulating substrate 11 and the second insulating substrate 61 (see FIG. 3).

In this way, the power module 1 according to this embodiment is produced.

Then, the controlling module 90 is provided on the upper surface (upper side) of the second radiating member 72 of the power module 1, in a manner shown in FIG. 1, and thereby, the module combined body 100 can be produced.

<<Operation and Effect>>

Next, the operation and effect by this embodiment that has the above-mentioned configuration will be described.

This embodiment has the first insulating-substrate-side member 10 that has the first insulating substrate 11, the first conductor layer 12 provided on the first insulating substrate 11, and the first electronic elements 31*a*, 32*a* provided on the first conductor layer 12, and the second insulating-substrate-side member 60 that has the second insulating substrate 61, the second conductor layer 62 provided on the second insulating substrate 61, and the second electronic elements 31*b*, 32*b* provided on the second conductor layer 62 (see FIG. 4(*a*), (*b*)). Thereby, it is possible to dispose the electronic elements 31*a*, 31*b*, 32*a*, 32*b* on both of the first insulating-substrate-side member 10 and the second insulating-substrate-side member 60, and to dispose the many electronic elements 31*a*, 31*b*, 32*a*, 32*b* in a small space.

Figure 7:
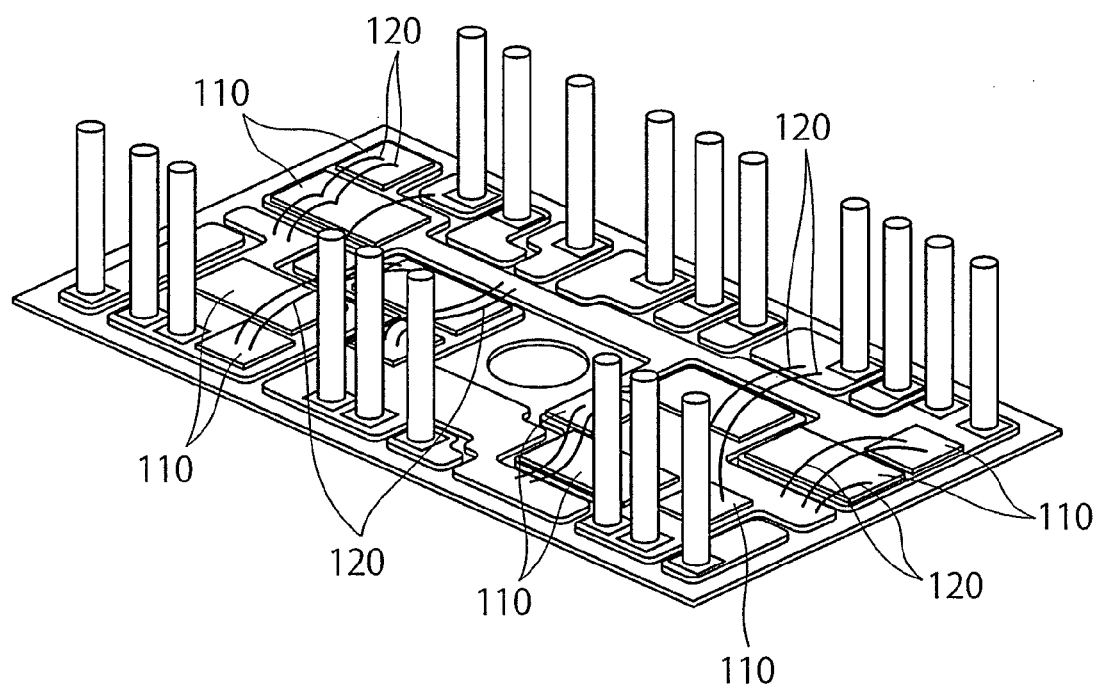
FIG. 7 is a schematic perspective diagram showing a conventional module.

That is, conventionally, an increase in the number of the electronic elements 110 leads to an increase in the size of the module in the planar direction (see FIG. 7). Further, since a space for providing a sealing member is required, it is difficult to dramatically decrease the thickness of the module. In contrast, according to this embodiment, the electronic elements 31*a*, 31*b*, 32*a*, 32*b* are disposed on both of the first insulating-substrate-side member 10 and the second insulating-substrate-side member 60, and the sealing member 80 is provided so as to cover these electronic elements 31*a*, 31*b*, 32*a*, 32*b*. Therefore, it is possible to dispose the many electronic elements 31*a*, 31*b*, 32*a*, 32*b* in a small space, without increasing the thickness too much.

Further, according to this embodiment, the heat of the first electronic elements 31*a*, 32*a* can be primarily radiated from the first insulating substrate 11 side, and the heat of the second electronic elements 31*b*, 32*b* can be primarily radiated from the second insulating substrate 61 side. Therefore, it is possible to realize a high heat radiation.

That is, conventionally, the heat of the electronic elements 110 that are provided in a planar form can be primarily radiated only from one surface such as the back surface (see FIG. 7), resulting in an insufficient heat radiation. In contrast, according to this embodiment, the heat from the first electronic elements 31*a*, 32*a* provided on the first insulating substrate 11 side is primarily radiated from the first insulating substrate 11 side, and the heat from the second electronic elements 31*b*, 32*b* provided on the second insulating substrate 61 side is primarily radiated from the second insulating substrate 61 side. Therefore, it is possible to realize a high heat radiation. In addition, according to this embodiment, naturally, the heat from the first electronic elements 31*a*, 32*a* can be radiated from the second insulating substrate 61 side through the element connecting conductor post 51, and the heat from the second electronic elements 31b, 32b can be radiated from the first insulating substrate 11 side through the element connecting conductor post 51 and the layer connecting conductor post 52.

Further, the first electronic elements 31a, 32a and the second electronic elements 31b, 32b are opposingly disposed, and the first electronic elements 31a, 32a and the second electronic elements 31b, 32b are connected by the element connecting conductor post 51 that has electric conductivity (see FIG. 2 and FIG. 3). Thereby, it is possible to position the first electronic elements 31a, 32a and the second electronic elements 31b, 32b at a short distance, and to connect the first electronic elements 31a, 32a and the second electronic elements 31b, 32b by the element connecting conductor post 51 that has a lower electric resistance compared to a wire. Therefore, it is possible to reduce the parasitic inductance and the wiring resistance.

That is, conventionally, the electronic elements 110 are provided in the planar direction, resulting in a long distance between the electronic elements 110 (see FIG. 7). Further, conventionally, the electronic elements 110 are connected by the wire 120, resulting in a high electric resistance. In contrast, according to this embodiment, the first electronic elements 31a, 32a and the second electronic elements 31b, 32b can be opposingly disposed, the first electronic elements 31a, 32a and the second electronic elements 31b, 32b can be positioned at a short distance, and the first electronic elements 31a, 32a and the second electronic elements 31b, 32b can be connected by the element connecting conductor post 51 instead of a wire. Thereby, it is possible to reduce the parasitic inductance and the wiring resistance, compared to the conventional one.

Further, in this embodiment, the first switching element 31a and the second rectifying element 32b are opposed, and the second switching element 31b and the first rectifying element 32a are opposed (see FIG. 2 to FIG. 4(a), (b)). Then, the element connecting conductor post unit 51a connects the first switching element 31a and the second rectifying element 32b, and the element connecting conductor post unit 51b connects the second switching element 31b and the first rectifying element 32a.

In general, the heat generation from a switching element such as a bipolar transistor is higher compared to the heat generation from a rectifying element such as a diode. In this regard, according to this embodiment, the first switching element 31a to generate a relatively high heat and the second rectifying element 32b to generate a relatively low heat are close in the vertical direction, and the second switching element 31b to generate a relatively high heat and the first rectifying element 32a to generate a relatively low heat are close in the vertical direction. Thereby, it is possible to avoid the vertical closing between the switching elements 31a, 31b to generate a high heat, and it is possible to realize a high heat radiation.

Here, in this embodiment, the thickness of the element connecting conductor post units 51a, 51b that connect the first electronic elements 31a, 32a and the second electronic elements 31b, 32b is greater than the thickness of the conductor foil 53 that, in a plane, connects the first switching element 31a and the first rectifying element 32a and connects the second switching element 31b and the second rectifying element 32b. Thereby, the element connecting conductor post units 51a, 51b can have a higher thermal conductivity than the thermal conductivity by the conductor foil 53. In such a situation, it is essentially significant that the first switching element 31a to generate a relatively high heat and the second rectifying element 32b to generate a relatively low heat are opposed, and the second switching element 31b to generate a relatively high heat and the first rectifying element 32a to generate a relatively low heat are opposed.

Further, as shown in FIG. 4(a), (b), this embodiment has an arrangement structure with a bilateral symmetry (a symmetry with respect to line $A_1$-$A_1$ in FIG. 4(a) and line $A_2$-$A_2$ in FIG. 4(b)), and therefore, it is possible to radiate the heat in a bilaterally-symmetrical and balanced manner.

Figure 5:
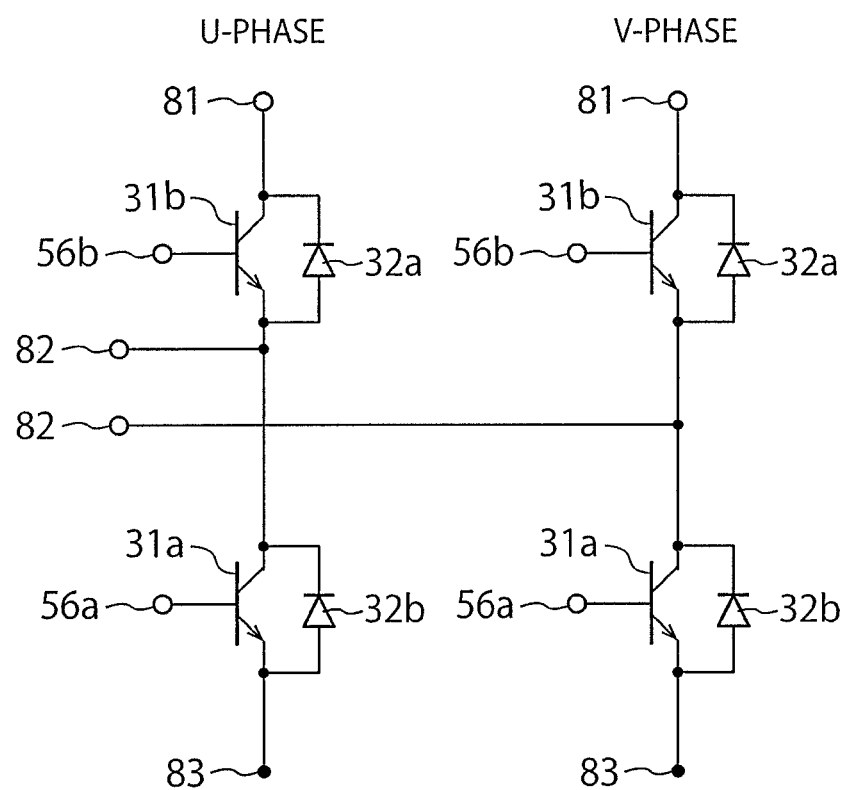
FIG. 5 is a diagram showing a circuit that is used in the module according to the first embodiment of the present invention.
Figure 6:
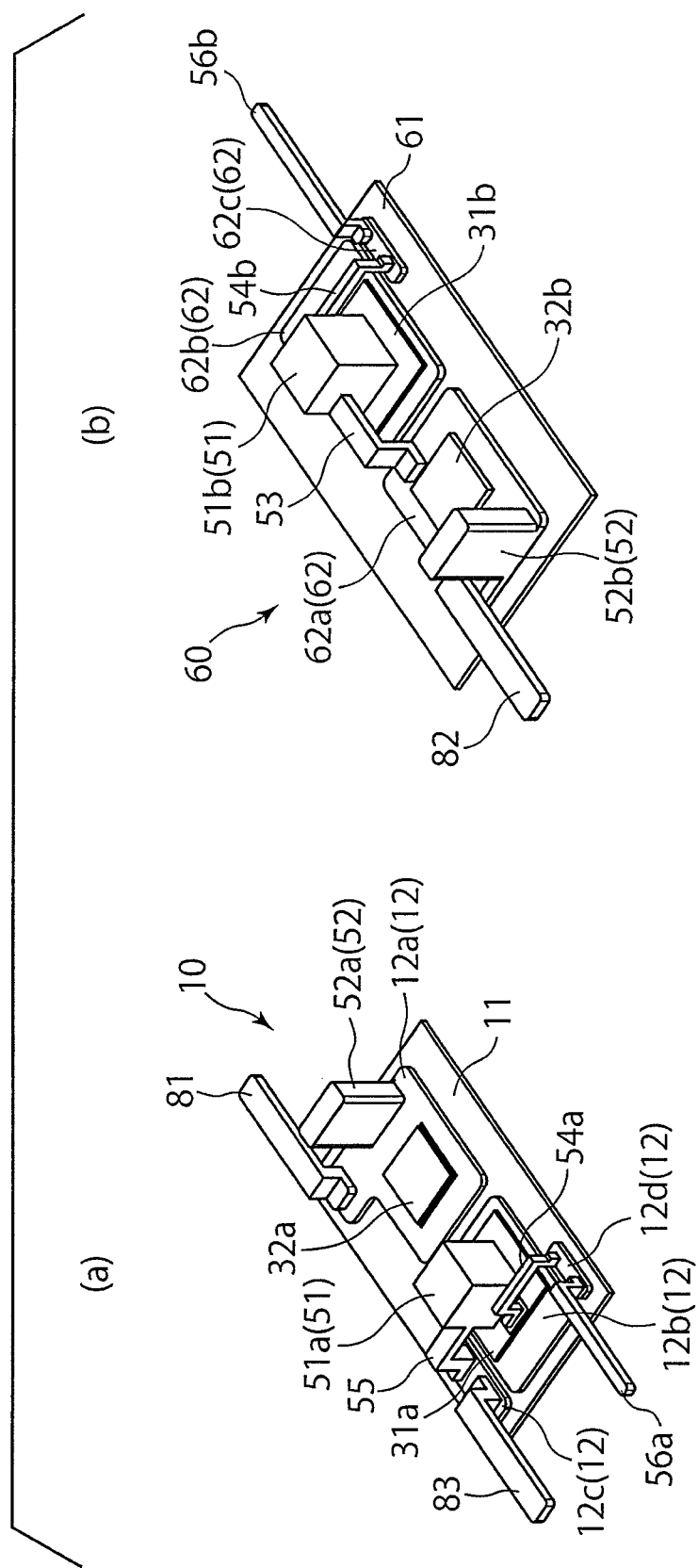
FIG. 6(a) is a schematic perspective diagram showing a first insulating-substrate-side member and FIG. 6(b) is a schematic perspective diagram showing a second insulating-substrate-side member, in a module according to a second embodiment of the present invention.

Further, in this embodiment, the first switching element 31a is provided on the first conductor layer unit 12b, and the first rectifying element 32a is provided on the first conductor layer unit 12a. Also, the second switching element 31b is provided on the second conductor layer unit 62b, and the second rectifying element 32b is provided on the second conductor layer unit 62a. Then, the layer connecting conductor post unit 52b connects the first conductor layer unit 12b and the second conductor layer unit 62a, and the layer connecting conductor post unit 52a connects the second conductor layer unit 62b and the first conductor layer unit 12a. Thereby, as shown in FIG. 5, it is possible to dispose the first switching element 31a (in FIG. 5, a bipolar transistor) and the second rectifying element 32b (in FIG. 5, a diode) in parallel, and to dispose the second switching element 31b (in FIG. 5, a bipolar transistor) and the first rectifying element 32a (in FIG. 5, a diode) in parallel. In FIG. 5, the left side is a U-phase, and the right side is a V-phase.

In the mode shown in FIG. 5, each of the first switching element 31a and the second switching element 31b is an NPN bipolar transistor. The terminal on the collector side of the NPN bipolar transistor is connected with the terminal on the cathode side of the diode, and the terminal on the emitter side is connected with the terminal on the anode side of the diode.

Further, in this embodiment, the first switching element 31a and the first rectifying element 32a are connected by the conductor foil 53 instead of a wire, and the second switching element 31b and the second rectifying element 32b are connected by the conductor foil 53 instead of a wire. Thereby, it is possible to reduce the wiring resistance and the parasitic inductance, and consequently to suppress the heat generation. Also, such a reduction in the wiring resistance and the parasitic inductance allows for a decrease in the influence of noise at the time of a switching operation.

Further, in this embodiment, the first control terminal 56a is connected with the first switching element 31a, and the second control terminal 56b is connected with the second switching element 31b. Thereby, as shown in FIG. 5, these first control terminal 56a and second control terminal 56b can function as the bases of the switching elements (bipolar transistors) 31a, 31b.

Further, in this embodiment, the external terminal 81 is connected with the first rectifying element 32a, the external terminal 82 is connected with the second rectifying element 32b, and the external terminal 83 is connected with the first switching element 31a. Then, as shown in FIG. 5, the external terminal 81 can function as the collector, and the external terminal 83 can function as the emitter. The external terminal 82 can function as an intermediate terminal.

Further, in this embodiment, the heat radiation can be performed through each of the first control terminal 56a, the second control terminal 56b and the external terminals 81 to 83, and the heat radiation can be performed not only from the normal direction of the planes of the first insulating substrate 11 and the second insulating substrate 61 but also from the extending direction of these planes (hereinafter, referred to as the "in-plane direction"). In this regard, the conductor foil 53 is used in this embodiment, and therefore the thermal conductivity in the in-plane direction is also high. Thereby, it is very advantageous that the heat radiation can be performed also from each of the first control terminal 56a, the second control terminal 56b and the external terminals 81 to 83 in this way.

Here, it is thought that the heat radiation in the normal direction of the planes of the first insulating substrate 11 and the second insulating substrate 61 is primarily performed in the range of 45 degrees or less from the normal direction. In this regard, the heat radiation in the in-plane direction according to this embodiment is primarily performed in the range other than the range of 45 degrees, resulting in a high heat-radiation efficiency.

Further, in this embodiment, the first radiating member 71 is provided on the lower side of the first insulating substrate 11, and the second radiating member 72 is provided on the upper side of the second insulating substrate 61. Thereby, it is possible to more increase both the heat radiation in the normal direction of the plane of the first insulating substrate 11 and the heat radiation in the normal direction of the plane of the second insulating substrate 61.

Second Embodiment

Next, a second embodiment of the present invention will be described.

The above-described first embodiment has a mode of using a "4 in 1" in which four electronic elements are provided, but, without being limited to this, it is possible to use a mode of "'n' in 1" in which "n" electronic elements are provided, such as "2 in 1" in which two electronic elements are provided, or "6 in 1" in which six electronic elements are provided.

All of such modes can exhibit the same effect as the above-described embodiment.

The second embodiment will be described using a mode of "2 in 1" in which two electronic elements are provided, as an example. Here, the effects to be achieved have been described in detail in the first embodiment, and therefore, the effects to be achieved in the second embodiment will be appropriately omitted and briefly described.

First, it is possible to dispose the electronic elements 31a, 31b, 32a, 32b on both of the first insulating-substrate-side member 10 and the second insulating-substrate-side member 60, and to dispose the many electronic elements 31a, 31b, 32a, 32b in a small space.

Further, the heat of the first electronic elements 31a, 32a can be primarily radiated from the first insulating substrate 11 side, and the heat of the second electronic elements 31b, 32b can be primarily radiated from the second insulating substrate 61 side. Therefore, it is possible to realize a high heat radiation.

Further, it is possible to position the first electronic elements 31a, 32a and the second electronic elements 31b, 32b at a short distance, and to connect the first electronic elements 31a, 32a and the second electronic elements 31b, 32b by the element connecting conductor post 51 that has a lower electric resistance compared to a wire. Therefore, it is possible to reduce the parasitic inductance and the wiring resistance.

Further, the first switching element 31a to generate a relatively high heat and the second rectifying element 32b to generate a relatively low heat are opposed, and the second switching element 31b to generate a relatively high heat and the first rectifying element 32a to generate a relatively low heat are opposed. Therefore, it is possible to avoid the vertical closing between the switching elements 31a, 31b to generate a high heat. Thereby, it is possible to realize a high heat radiation.

Further, the first switching element 31a and the first rectifying element 32a are connected by the conductor foil 53, and the second switching element 31b and the second rectifying element 32b are connected by the conductor foil 53. Therefore, it is possible to reduce the wiring resistance and the parasitic inductance, and consequently to suppress the heat generation. Also, such a reduction in the wiring resistance and the parasitic inductance allows for a decrease in the influence of noise at the time of a switching operation.

Further, the heat radiation can be performed through each of the first control terminal 56a, the second control terminal 56b and the external terminals 81 to 83. Thereby, the heat radiation can be performed not only from the normal direction of the planes of the first insulating substrate 11 and the second insulating substrate 61 but also from the in-plane direction of the first insulating substrate 11 and the second insulating substrate 61.

In the case where the first radiating member 71 and the second radiating member 72 are provided similarly to the first embodiment, it is possible to more increase both the heat radiation in the normal direction of the plane of the first insulating substrate 11 and the heat radiation in the normal direction of the plane of the second insulating substrate 61.

Finally, the disclosure of the descriptions and drawings for the above-described embodiments is just one example for explaining the inventions described in the claims, and the inventions described in the claims are not limited by the disclosure of the descriptions or drawings for the above-described embodiments.

1 power module
10 first insulating-substrate-side member
11 first insulating substrate
12 first conductor layer
12a to 12d first conductor layer unit
31a first switching element (first electronic element)
32a first rectifying element (first electronic element)
31b second switching element (second electronic element)
32b second rectifying element (second electronic element)
60 second insulating-substrate-side member
61 second insulating substrate
62 second conductor layer
62a to 62c second conductor layer unit
51 element connecting conductor post
51a, 51b element connecting conductor post unit
52 layer connecting conductor post
52a, 52b layer connecting conductor post unit
53 conductor foil
56a first control terminal
56b second control terminal
71 first radiating member
72 second radiating member
80 sealing member
81 external terminal
82 external terminal
83 external terminal
90 controlling module
100 module combined body

The invention claimed is:
1. A module comprising:
a first insulating-substrate-side member that has a first insulating substrate, a first conductor layer provided on an upper side of the first insulating substrate, and a first electronic element provided on an upper side of the first conductor layer;
a second insulating-substrate-side member that has a second insulating substrate, a second conductor layer provided on a lower side of the second insulating substrate, and a second electronic element provided on a lower side of the second conductor layer; and a sealing member that is provided between the first insulating substrate and the second insulating substrate, wherein the first electronic element and the second electronic element are opposingly disposed, and the first electronic element and the second electronic element are connected by an element connecting conductor post that has electric conductivity, the first electronic element has a first switching element and a first rectifying element, the second electronic element has a second switching element and a second rectifying element, the element connecting conductor post has a plurality of element connecting conductor post units, one of the element connecting conductor post units connects the first switching element and the second rectifying element, another one of the element connecting conductor post units connects the second switching element and the first rectifying element, the first conductor layer has a plurality of first conductor layer units, the second conductor layer has a plurality of second conductor layer units, the first switching element is provided on one of the first conductor layer units, the first rectifying element is provided on another one of the first conductor layer units, the second switching element is provided on one of the second conductor layer units, the second rectifying element is provided on another one of the second conductor layer units, a layer connecting conductor post that has electric conductivity and connects the first conductor layer unit and the second conductor layer unit is provided, the layer connecting conductor post has a plurality of layer connecting conductor post units, one of the layer connecting conductor post units connects the first conductor layer unit on which the first switching element is provided and the second conductor layer unit on which the second rectifying element is provided, and another one of the layer connecting conductor post units connects the second conductor layer unit on which the second switching element is provided and the first conductor layer unit on which the first rectifying element is provided.

2. The module according to claim 1, wherein the first switching element and the first rectifying element are connected by a conductor foil that has electric conductivity, or the second switching element and the second rectifying element are connected by a conductor foil that has electric conductivity.

3. The module according to claim 1, further comprising:

a first control terminal that is connected with the first switching element, and a second control terminal that is connected with the second switching element.

4. The module according to claim 1, further comprising:

an external terminal that is connected with the first switching element, the first rectifying element, the second switching element or the second rectifying element.

5. The module according to claim 1, wherein each of the first switching element and the second switching element is a bipolar transistor.

6. The module according to claim 1, wherein each of the first rectifying element and the second rectifying element is a diode.

7. The module according to claim 1, further comprising:

a first radiating member that is provided on a lower side of the first insulating substrate, and a second radiating member that is provided on an upper side of the second insulating substrate.

8. The module according to claim 7, wherein each of the first radiating member and the second radiating member is a radiator foil that has thermal conductivity.

9. A module combined body comprising:

a power module that controls electric power; and a controlling module that controls the power module, wherein the power module is the module according to claim 1, and the controlling module is provided on a lower side of the first insulating substrate or an upper side of the second insulating substrate of the power module.

10. A module production method, comprising:

preparing a first insulating-substrate-side member that has a first insulating substrate, a first conductor layer provided on an upper side of the first insulating substrate, and a first electronic element provided on an upper side of the first conductor layer;

preparing a second insulating-substrate-side member that has a second insulating substrate, a second conductor layer provided on an upper side of the second insulating substrate, and a second electronic element provided on an upper side of the second conductor layer;

inverting the second insulating substrate upside down, opposingly disposing the first electronic element and the second electronic element, and connecting the first electronic element and the second electronic element with an element connecting conductor post that has electric conductivity; and injecting a sealing member and disposing the sealing member between the first insulating substrate and the second insulating substrate, wherein the first electronic element has a first switching element and a first rectifying element, the second electronic element has a second switching element and a second rectifying element, the element connecting conductor post has a plurality of element connecting conductor post units, one of the element connecting conductor post units connects the first switching element and the second rectifying element, another one of the element connecting conductor post units connects the second switching element and the first rectifying element, the first conductor layer has a plurality of first conductor layer units, the second conductor layer has a plurality of second conductor layer units, the first switching element is provided on one of the first conductor layer units, the first rectifying element is provided on another one of the first conductor layer units, the second switching element is provided on one of the second conductor layer units, the second rectifying element is provided on another one of the second conductor layer units, a layer connecting conductor post that has electric conductivity and connects the first conductor layer unit and the second conductor layer unit is provided, the layer connecting conductor post has a plurality of layer connecting conductor post units, one of the layer connecting conductor post units connects the first conductor layer unit on which the first switching element is provided and the second conductor layer unit on which the second rectifying element is provided, and another one of the layer connecting conductor post units connects the second conductor layer unit on which the second switching element is provided and the first conductor layer unit on which the first rectifying element is provided.

* * * * *